United States Patent
Anami (10) Patent No.: US 9,293,902 B2
(45) Date of Patent: Mar. 22, 2016

(54) ELECTRICAL JUNCTION BOX

(71) Applicant: SUMITOMO WIRING SYSTEMS, LTD., Mie (JP)

(72) Inventor: Shuichi Anami, Mie (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 0 days.

(21) Appl. No.: 14/431,486

(22) PCT Filed: Sep. 24, 2013

(86) PCT No.: PCT/JP2013/075741
§ 371 (c)(1),
(2) Date: Mar. 26, 2015

(87) PCT Pub. No.: WO2014/054462
PCT Pub. Date: Apr. 10, 2014

(65) Prior Publication Data
US 2015/0255969 A1  Sep. 10, 2015

(30) Foreign Application Priority Data
Oct. 4, 2012  (JP) .................................. 2012-222257

(51) Int. Cl.
*H05K 5/03* (2006.01)
*H02G 3/08* (2006.01)
(Continued)

(52) U.S. Cl.
CPC ............... *H02G 3/088* (2013.01); *B60R 16/02* (2013.01); *B60R 16/0239* (2013.01); *H05K 5/0208* (2013.01); *H05K 5/0217* (2013.01); *H05K 5/0221* (2013.01); *H05K 5/03* (2013.01);
(Continued)

(58) Field of Classification Search
CPC .............................. H05K 5/03; B60R 16/0239
USPC ........................................................ 439/76.2
See application file for complete search history.

(56) References Cited

U.S. PATENT DOCUMENTS

| 6,774,309 B2 * | 8/2004 | Kasai ...................... H02G 3/14 174/17 R |
| 7,253,356 B2 * | 8/2007 | Kiyota ................... H02G 3/081 174/17 R |

(Continued)

FOREIGN PATENT DOCUMENTS

| JP | 2000-050460 A | 2/2000 |
| JP | 2008-295263 A | 12/2008 |
| JP | 2010-051161 A | 3/2010 |

OTHER PUBLICATIONS

Nov. 26, 2013 International Search Report issued in International Patent Application No. PCT/JP/2013/075741.

*Primary Examiner* — Hung V Ngo
(74) *Attorney, Agent, or Firm* — Oliff PLC (57) ABSTRACT

An electrical junction box has a main body with a circuit board, and a cover arranged to accommodate the main body. One of the main body and the cover has a guide rib, and the other has a guide groove. The circuit board is arranged inside a side wall of the main body, and the guide rib or the guide groove is formed on an outer surface of the side wall. At least one of the side wall of the main body and the cover has a water capturing groove located between the guide rib or the guide groove and the circuit board relative to a first direction along a periphery of the main body such that the water capturing groove captures water that has entered the cover via a gap between the guide rib and the guide groove before the water reaches the circuit board.

14 Claims, 7 Drawing Sheets

(51) Int. Cl.
  *B60R 16/023*  (2006.01)
  *H05K 5/02*  (2006.01)
  *B60R 16/02*  (2006.01)
  *H05K 7/14*  (2006.01)
  *H02G 3/14*  (2006.01)

(52) U.S. Cl.
  CPC .............. *H05K7/1427* (2013.01); *H02G 3/086* (2013.01); *H02G 3/14* (2013.01)

(56) References Cited

U.S. PATENT DOCUMENTS

| | | | | |
|---|---|---|---|---|
| 7,671,275 B2* | 3/2010 | Kubota | .............. | H01R 13/5227 174/17 R |
| 7,775,807 B2* | 8/2010 | Yamaguchi | .......... | H01R 9/2466 439/206 |
| 7,907,401 B2* | 3/2011 | Bolzmann | ............ | H05K 5/0073 174/547 |
| 8,338,704 B2* | 12/2012 | Mizukami | ........... | B60R 16/0239 174/50 |
| 2003/0219998 A1* | 11/2003 | Kakuta | .............. | H01R 13/5227 439/76.2 |
| 2004/0214458 A1* | 10/2004 | Maebashi | ................ | H01H 9/10 439/76.2 |
| 2005/0130460 A1* | 6/2005 | Kiyota | ................ | B60R 16/0238 439/76.2 |
| 2006/0024992 A1* | 2/2006 | Kanazawa | ......... | H01R 13/5202 439/76.2 |
| 2008/0299799 A1 | 12/2008 | Yoshida et al. | | |
| 2008/0299800 A1* | 12/2008 | Yoshida | .............. | H01R 13/5227 439/76.2 |
| 2009/0298310 A1* | 12/2009 | Nakanishi | .............. | H02G 3/088 439/76.2 |

* cited by examiner

ELECTRICAL JUNCTION BOX

BACKGROUND

This application is a national stage application of PCT/JP2013/075741, international filing date Sep. 24, 2013, and claims priority to JP 2012-222257, filed in Japan on Oct. 4, 2012, the entire disclosures of which are hereby incorporated by reference in their entirety.

The present invention relates to an electrical junction box in which a cover is assembled to a main body provided with a circuit board, and in particular to an electrical junction box in which a cover is assembled to a main body by being guided by a guiding effect of a guide rib provided on one of the main body and the cover, and a guide groove provided on the other.

Conventionally, electrical junction boxes are used in automobiles and the like in order for electrical components such as fuses, relays, and the like to be arranged efficiently with regard to space, for example. As such an electrical junction box, an electrical junction box as disclosed in, for example, JP 2008-295263A is known that has a structure in which a main body provided with a circuit board such as a printed-circuit board is accommodated in the cover.

Meanwhile, as disclosed in JP 2008-295263A as well, an electrical junction box in which a cover is assembled while accommodating a main body may have a structure in which, in order to externally fit the cover to the main body smoothly, a guide rib is provided protruding from one of a wall section of the main body and the inner surface of the cover, and a guide groove is provided on the other, and the cover is guided to the main body by a guiding effect of the guide rib and the guide groove.

However, in some cases a small gap is created between the open end of the cover and the main body, and water enters the cover via this gap. Furthermore, there is the risk that the water that has entered the cover reaches the circuit board of the main body due to capillary action occurring in the micro-gap between the main body and the cover, possibly causing a short circuit or corrosion of the circuit board. Particularly, when the guide rib and the guide groove are provided, capillary action is highly likely to occur in the micro-gap between the guide rib and the guide groove, and there is the risk that water that has entered the cover from the open end thereof climbs in the guide groove, moves in the micro-gap between the cover and the main body from the guide groove in the direction of the periphery, and thereby reaches the circuit board.

SUMMARY

Preferred embodiments were made in view of the above-described circumstances, and it is an object thereof to provide an electrical junction box with a novel structure in which a cover is assembled to a main body provided with a circuit board by being guided by a guide rib and a guide groove, the electrical junction box being capable of preventing water that has entered the cover from reaching the circuit board.

A first aspect of a preferred embodiment is an electrical junction box comprising a main body provided with a circuit board, and a cover arranged to accommodate the main body. One of the main body and the cover has a guide rib, and another one of the main body and the cover has a guide groove. The guide rib and the guide groove are arranged relative to each other so as to guide the cover to the main body. The circuit board is arranged inside a side wall of the main body which is overlapped by the cover, and the guide rib or the guide groove is formed on an outer surface of the side wall. At least one of the side wall of the main body and the cover that overlaps the side wall has a water capturing groove that is located at a position between the guide rib or the guide groove and the circuit board relative to a first direction along a periphery of the main body such that the water capturing groove is arranged to capture water that has entered the cover via a gap between the guide rib and the guide groove before the water reaches the circuit board.

In the first aspect, since at least one of the main body and the cover has the water capturing groove, a gap dimension between the main body and the cover may be large. Accordingly, it is possible to prevent capillary action of water that moves in the micro-gap between the main body and the cover from occurring in the water capturing groove. Furthermore, by providing such a water capturing groove between the guide rib/the guide groove and the circuit board in the direction of the periphery of the main body, water that climbs in the cover via the micro-gap between the guide rib and the guide groove due to capillary action, and moves in the micro-gap between the main body and the cover in the direction of the periphery of the main body can be captured in the water capturing groove before reaching the circuit board, making it possible to prevent the circuit board from getting wet.

Note that the water capturing groove needs only to be provided on at least one of the main body and the cover, and may also be provided on both of the main body and the cover. The number of the water capturing grooves is not limited, and a plurality of water capturing grooves may also be formed in the direction of the periphery of the main body.

A second aspect of a preferred embodiment is the electrical junction box according to the first aspect, wherein the guide rib is formed on the main body, and the guide groove and the water capturing groove are formed on the cover.

Ordinarily, when the main body is provided with a circuit board, the main body has a complicated shape since it includes mounted sections and the like for electrical components such as connectors and fuses that are to be connected to the circuit board. On the other hand, the cover has a relatively simple shape, and can thus ensure relatively easily a formation space in which the guide groove and the water capturing groove are to be formed, and thus it is easy to form the guide groove and the water capturing groove. Furthermore, by forming both the groove-shaped guide groove and water capturing groove on the cover, it is also possible to simplify the design of a molding form of the cover.

A third aspect of a preferred embodiment is the electrical junction box according to the second aspect, wherein a lock section is formed on an outer surface of the cover, and the guide groove and the water capturing groove are formed by sections of the outer surface of the cover that are between the lock section and an opening of the cover protruding outward.

If the cover section has the lock section, the space between the lock section and the opening of the cover will be a vacant space since a counterpart lock section will be located therein. Therefore, by forming the guide groove and the water capturing groove using this vacant space with the protrusions to the outside, it is possible to form the guide groove and the water capturing groove efficiently with regard to space. Furthermore, by suppressing the extent of the protrusions, serving as the guide groove and the water capturing groove, to the outside of the cover to the extent that is equal to or smaller than the extent of protrusion of the lock section, it is possible to form the guide groove and the water capturing groove without making the outer dimension of the electrical junction box larger.

A fourth aspect of a preferred embodiment is the electrical junction box according to the second or third aspect, wherein an end of the water capturing groove is open at an open end surface of the cover.

In this aspect, since the end of the water capturing groove that is formed by the outer surface of the cover protruding outward is open at an open end surface of the cover, the end of the water capturing groove may open toward the external space of the cover in a state in which the cover is assembled to the main body. Accordingly, it is possible to drain water that was captured in the water capturing groove via an end of the water capturing groove that is in communication with the outside of the cover.

In the preferred embodiments, at least one of the main body and the cover may be provided with the water capturing groove that prevents capillary action from occurring, the water capturing groove being provided at a position between the guide groove/the guide rib for guiding the cover, and the circuit board in the direction of the periphery of the main body. Accordingly, it is possible to prevent water that has entered via the engaging surfaces of the cover and the main body and moved in the micro-gap between the main body and the cover in the direction of the periphery due to capillary action from reaching the circuit board through the micro-gap between the guide groove and the guide rib. As a result, it is possible to prevent the circuit board from getting wet and to reduce the risk of a short circuit or corrosion of the circuit board due to the circuit board getting wet.

DETAILED DESCRIPTION OF EMBODIMENTS

Hereinafter, preferred embodiments will be described with reference to the drawings.

Figure 1:
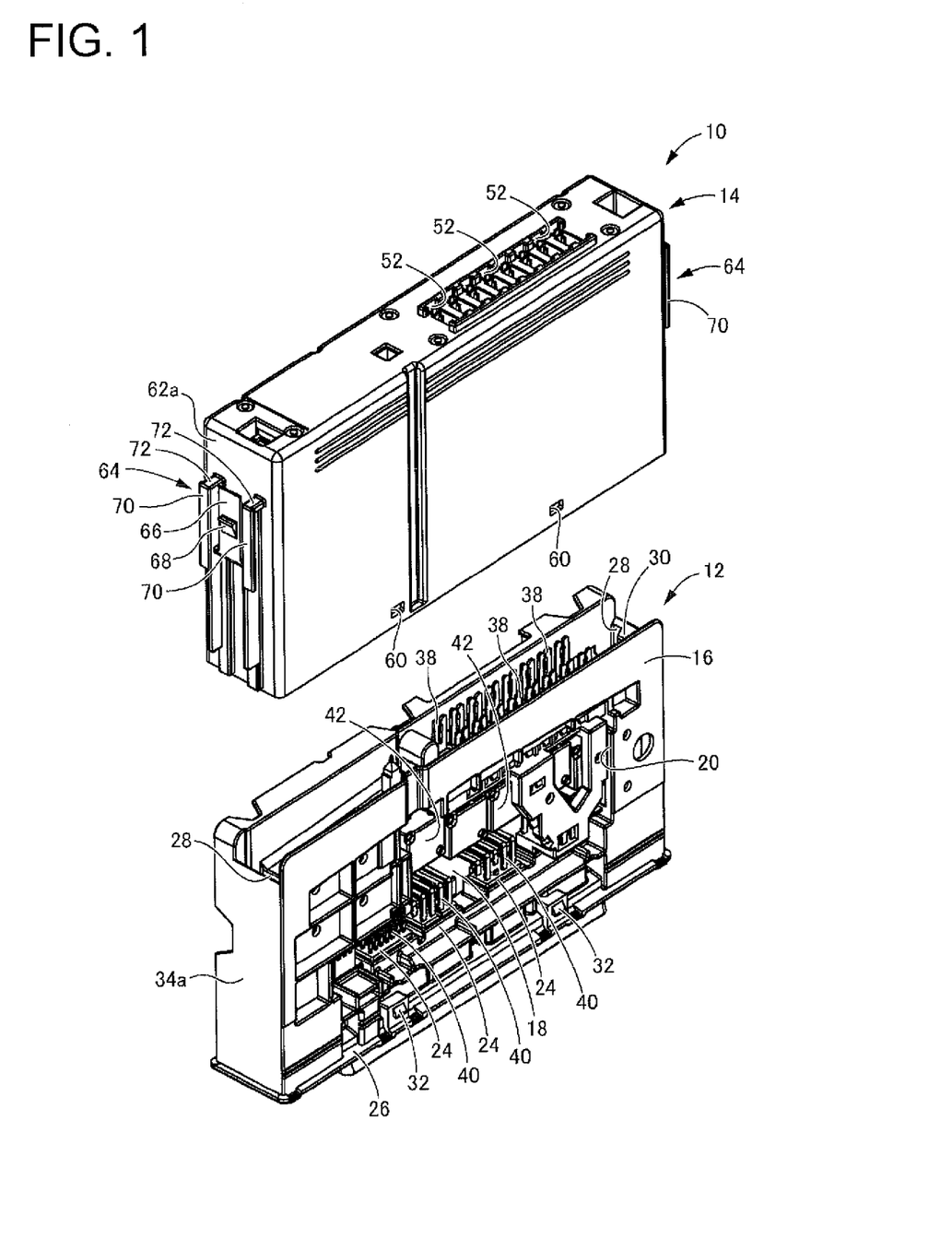
FIG. 1 is an exploded perspective view of an electrical junction box serving as a preferred embodiment.

First, FIG. 1 shows an electrical junction box 10 serving as a preferred embodiment. The electrical junction box 10 may include a main body 12 and a cover 14, and by being externally fitted to the main body 12, the cover 14 is assembled such that the main body 12 is accommodated in the cover 14. The electrical junction box 10 may be accommodated in, for example, another electrical junction box such as a relay box, and may be mounted in a vehicle such as an automobile.

Figure 2:
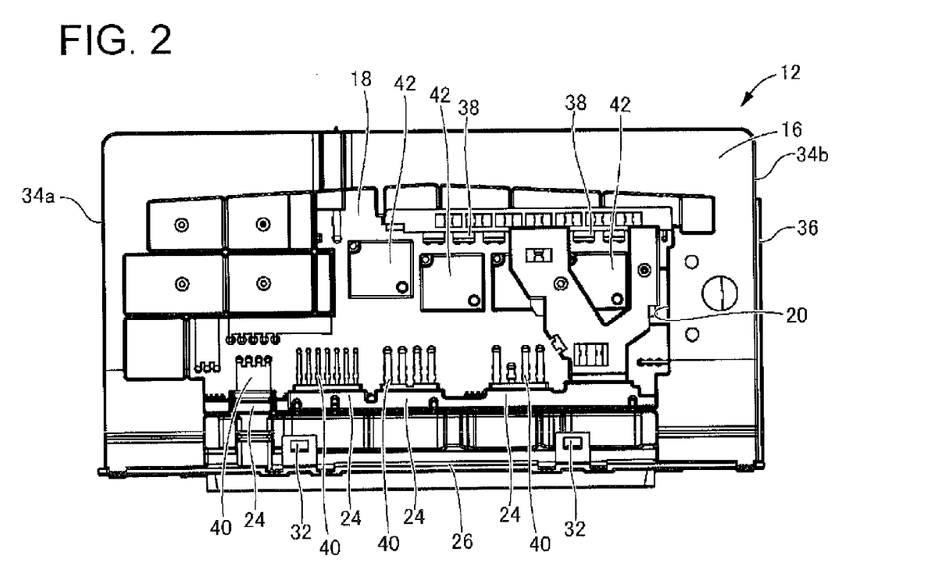
FIG. 2 is a front view of a main body.

FIGS. 2 to 6 show the main body 12. The main body 12 may have, for example, an elongated rectangular block shape as a whole. The main body 12 may have a structure in which a printed-circuit board 18 serving as a circuit board is assembled in a frame 16 made of a synthetic resin. Note that the circuit board is not limited to a printed-circuit board, and may also be busbars and the like. The main body 12 may be configured to be mounted in a vehicle such that the up-down direction in FIG. 2 is the vertical up-down direction. In the following description, the vertical direction refers to the vertical direction in FIG. 2.

Figure 4:
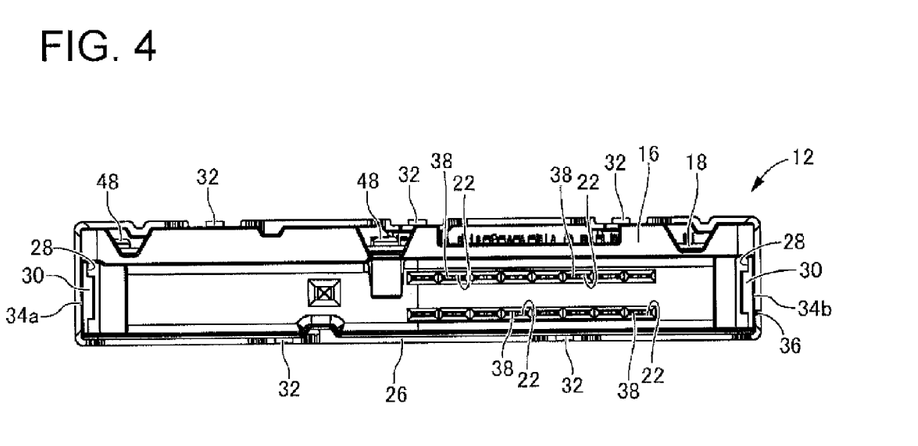
FIG. 4 is a top view of the main body.

The frame 16 may have a shape of, for example, a substantially elongated rectangular frame that may have, in the center thereof, a center hole 20. As shown in FIG. 4, a plurality of fuse terminal insertion holes 22 into which fuse terminals 38, which will be described later, are to be inserted may be formed, for example, in parallel to each other in two lines on substantially half of the upper surface of the frame 16 with respect to the longitudinal direction, and the fuse terminal insertion holes 22 in the respective lines face each other. Furthermore, in the lower portion of the frame 16, a plurality of connectors 24 into which connector terminals 40, which will be described later, are inserted may be formed in, for example, a line in the longitudinal direction of the frame 16.

Furthermore, an abutment restricting surface 26 may be formed on the lower end of the frame 16. As is clear from FIG. 4, the abutment restricting surface 26 may be formed protruding outward from the frame 16 and extending continuously over substantially the entire periphery of the frame 16.

Furthermore, drain holes 28 that are formed penetrating through the frame 16 in the vertical direction may be respectively formed on two ends in the longitudinal direction (the horizontal direction in FIG. 4) of the frame 16. As shown in the enlarged view of FIG. 6, the inner surface of each of the drain holes 28 that is located outward in the longitudinal direction of the frame 16 may have a main locking claw 30 protruding inward in the drain hole 28.

Furthermore, a plurality of sub locking claws 32 may be formed slightly above the abutment restricting surface 26 on the front surface (see FIG. 2) and the rear surface (see FIG. 3) of the frame 16. Each sub locking claw 32 may be formed protruding outward from the frame 16. The sub locking claws 32 may be formed with appropriate intervals in the direction of the periphery of the frame 16, with, for example, two sub locking claws being formed on the front surface of the frame 16 and three sub locking claws being formed on the rear surface of the frame 16.

Figure 5:
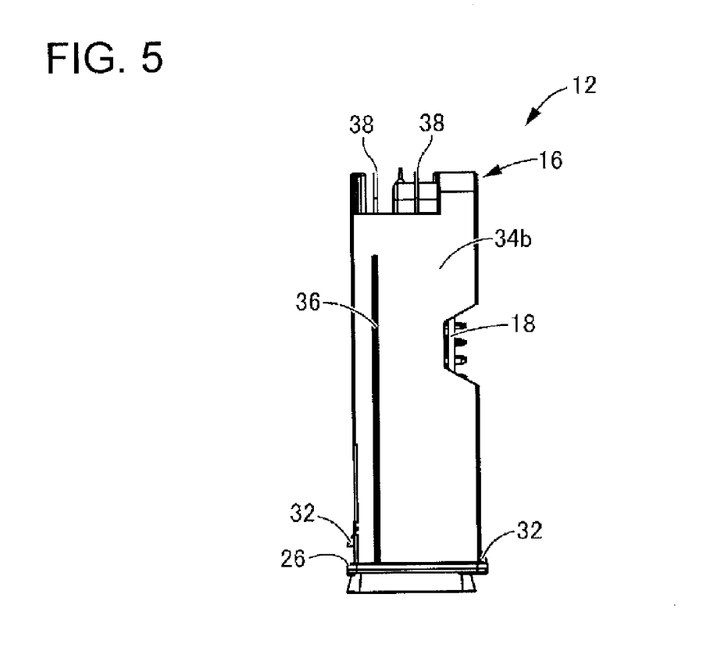
FIG. 5 is a side view of the main body.
Figure 6:
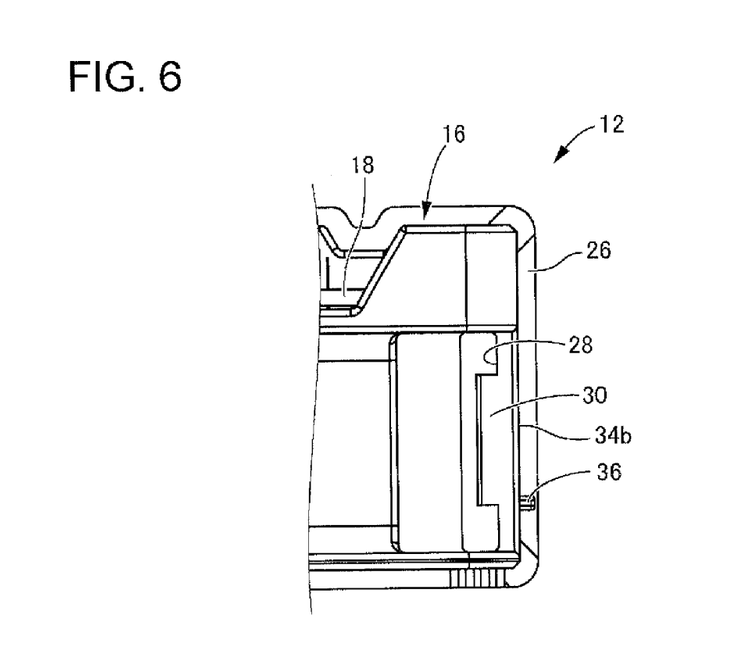
FIG. 6 is an enlarged view of a relevant part of a top surface of the main body.

Furthermore, side walls 34*a* and 34*b* may be formed at the two ends in the longitudinal direction of the frame 16. The side walls 34*a* and 34*b* may be, for example, flat surfaces that extend in the vertical direction. As shown in FIGS. 5, 6, and the like, a guide rib 36 may be formed on one side wall 34*b*. The guide rib 36 may protrude outward from the side wall 34*b* in the longitudinal direction of the frame 16, and extend in a straight line over substantially the entire length in the vertical direction of the side wall 34*b*. The guide rib 36 may be formed at a position in the front-back direction (horizontal direction in FIG. 5) of the frame 16 that is slightly deflected to the front of the frame 16 (leftward in FIG. 5). As is clear from FIG. 6, an extent of the protrusion of the guide rib 36 from the side wall 34*b* may be set to the extent of not protruding from the abutment restricting surface 26. Accordingly, the guide rib 36 is formed in this embodiment at only one position on the periphery of the main body 12.

The printed-circuit board 18 may be assembled to the rear surface (see FIG. 3) of the frame 16. The printed-circuit board 18 may have, for example, an elongated rectangular plate shape extending over substantially the entire rear surface of the frame 16. The printed-circuit board 18 may be provided with a plurality of fuse terminals 38, which are to be connected to fuses (not shown), and a plurality of connector terminals 40, which are to be connected to connectors (not shown). The fuse terminals 38 and the connector terminals 40 may be bent into, for example, an L-shape. Furthermore, a plurality of relays 42 may be provided in the central portion of the printed-circuit board 18.

Figure 3:
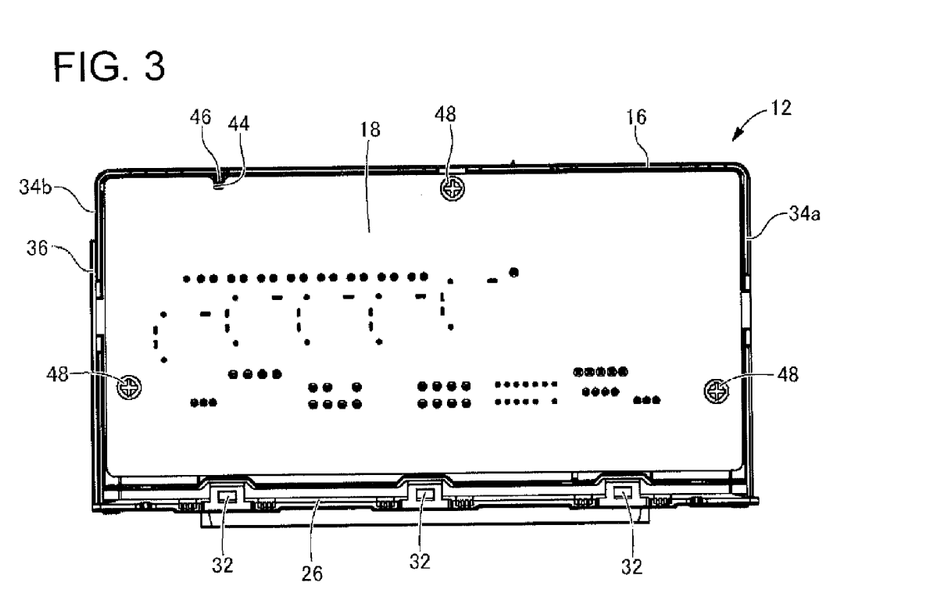
FIG. 3 is a rear view of the main body.

The printed-circuit board 18 may be assembled to the frame 16 such that, for example, the fuse terminals 38 and the connector terminals 40 are inserted in advance into the fuse terminal insertion holes 22 and the connector sections 24 of the frame 16, and, in this state, the printed-circuit board 18 on which the relays 42 are provided is overlaid on the rear surface of the frame 16. Note that, as shown in FIG. 3, a notch 44 may be formed on the periphery of the printed-circuit board 18, and the printed-circuit board 18 may be positioned with respect to the frame 16 by a positioning protrusion 46 of the frame 16 being inserted into the notch 44. Accordingly, the fuse terminals 38 and the connector terminals 40 may be inserted through the corresponding through holes of the printed-circuit board 18. Furthermore, after the printed-circuit board 18 is fixed to the frame 16 with a plurality (three in the present embodiment) of bolts 48, the fuse terminals 38 and the connector terminals 40 may be fixed to the printed-circuit board 18 by, for example, soldering. The main body 12 is configured in this manner.

Figure 7:
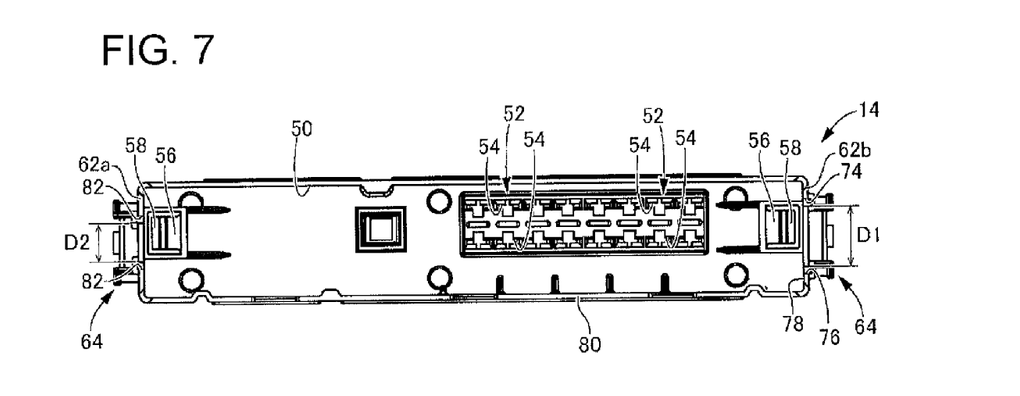
FIG. 7 is a bottom view of a cover.
Figure 8:
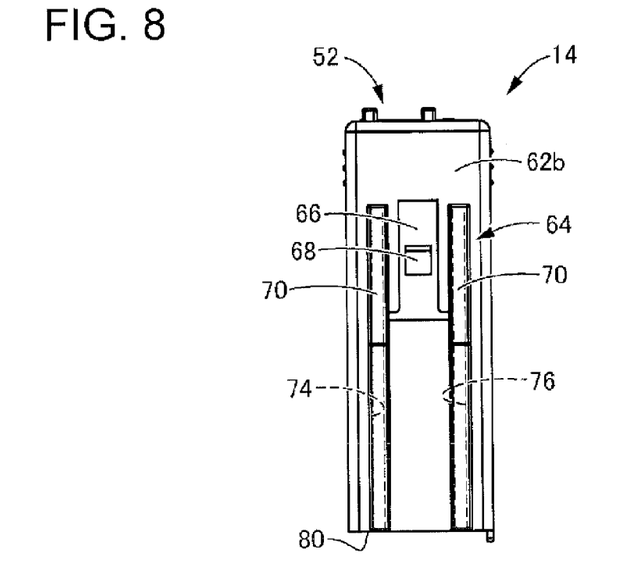
FIG. 8 is a side view of the cover.
Figure 9:
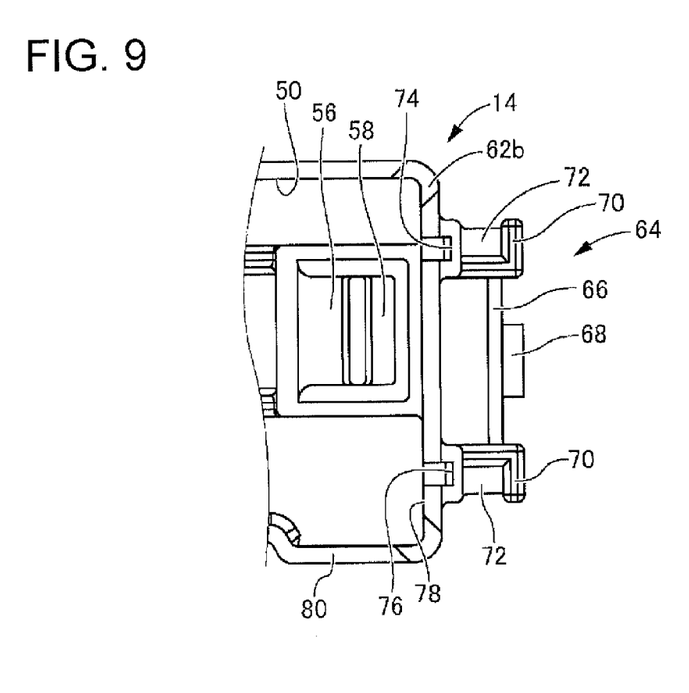
FIG. 9 is an enlarged view of a relevant part of the lower surface of the cover.

On the other hand, the cover 14 may be a synthetic resin molded article that is formed, for example, into one piece. FIGS. 7 to 9 show the cover 14. Note that FIGS. 7 and 9 show the lower surface of the cover 14. The cover 14 may have, for example, an elongated rectangular box shape, and may have an opening 50 on one side thereof. The upper surface of the cover 14 may have a plurality of fuse mounted sections 52 that are formed in, for example, one line over substantially half of the upper surface of the cover 14 with respect to the longitudinal direction. Each fuse mounted section 52 may have a pair of terminal insertion holes 54 that penetrate through the upper surface of the cover 14 and oppose each other.

Furthermore, a pair of main locks 56 may be formed on the two longitudinal ends of the cover 14. The main locks 56 may have elastically deformable protruding pieces that protrude downward into the cover 14 from the upper surface of the cover 14, the main locks 56 being formed into, for example, one piece with the cover 14. The main locks 56 may respectively have engaging claws 58 that protrude outward in the longitudinal direction of the cover 14.

Furthermore, as is clear from FIG. 1, rectangular sub lock holes 60 may be formed in the lower end portion of the cover 14 at positions that correspond to the sub locking claws 32 of the main body 12, the rectangular sub lock holes 60 penetrating through the cover 14. In the present embodiment, two sub lock holes 60 are formed on the surface of the cover 14 that overlaps the front surface (see FIG. 2) of the main body 12, whereas three sub lock holes 60 are formed on the surface of the cover 14 that overlaps the rear surface (see FIG. 3) of the main body 12.

Furthermore, external locks 64 may be respectively provided on outer surfaces of the side walls 62a and 62b of the cover 14 that are opposite to each other in the longitudinal direction. The external locks 64 have substantially the same shape, and thus a description will be given taking the external lock 64 of the side wall 62b shown in FIGS. 8 and 9 as an example. The external lock 64 may have an elastic piece 66 that protrudes outward from the side wall 62b in the longitudinal direction of the cover 14 and extends upward. The elastic piece 66 may have an engagement claw 68 that protrudes outward in the longitudinal direction of the cover 14. The external lock 64 also may have, for example, two guide sections 70 on the respective two sides of the elastic piece 66.

As is clear from FIG. 9 as well, the guide sections 70 may have, for example, an L-shaped cross section such that they protrude outward from the side wall 62b in the longitudinal direction of the cover 14 and protruding end edges thereof are bent at a right angle to the outside of the cover 14 in the corresponding directions that are perpendicular to the longitudinal direction of the cover 14 (vertical direction in FIG. 9), the guide sections 70 extending in the vertical direction. The lower ends of the guide sections 70 may be located slightly lower than the lower end of the elastic piece 66, and the upper ends of the guide sections 70 may be located at substantially the same level as the upper end of the elastic piece 66. Furthermore, the lower end edges of the guide sections 70 may be open downward, whereas the upper end edges of the guide sections 70 may respectively have abutment walls 72.

Furthermore, the side wall 62b of the cover 14 may have a guide groove 74 and a water capturing groove 76. The guide groove 74 and the water capturing groove 76 may have the same shape, that is, the shape of a groove that is open in the inner surface 78 of the side wall 62b and extends in the vertical direction. The guide groove 74 and the water capturing groove 76 may have the shape of a groove forming a recess that is open in the inner surface 78 of the side wall 62b by the portions of the side wall 62b that extend from the external lock 64 to the open end surface 80 of the cover 14 protruding outward, the guide groove 74 and the water capturing groove 76 being formed over the lower end edge of the cover 14 to the external lock 64 in the vertical direction. Accordingly, the lower ends of the guide groove 74 and the water capturing groove 76 may be open downward at the open end surface 80 of the cover 14. Furthermore, the upper end edges of the guide groove 74 and the water capturing groove 76 may be set at substantially the same positions as the upper end edges of the guide sections 70. The guide groove 74 and the water capturing groove 76 may be formed, for example, in parallel to each other at a predetermined distance in the direction (vertical direction in FIG. 9) that is perpendicular to the longitudinal direction of the cover 14, and the guide groove 74 may be located on the front surface side of the main body 12 (upper side in FIG. 9), and the water capturing groove 76 may be located on the rear surface side of the main body 12 (lower side in FIG. 9).

On the other hand, the side wall 62a may have a plurality (two in the present embodiment) of mis-coupling prevention grooves 82. Similarly to the guide groove 74 and the water capturing groove 76, the mis-coupling prevention grooves 82 may be formed into the shape of a groove that is open in the inner surface of the side wall 62a and extends in the vertical direction by the side wall 62a protruding outward, and are formed extending from the external lock 64 to the open end surface 80 of the cover 14.

Note that a separation distance D1 between the guide groove 74 and the water capturing groove 76 differs from a separation distance D2 between the mis-coupling prevention grooves 82, and the separation distance D1 between the guide, groove 74 and the water capturing groove 76 is larger than the separation distance D2 between the mis-coupling prevention grooves 82.

Figure 10:
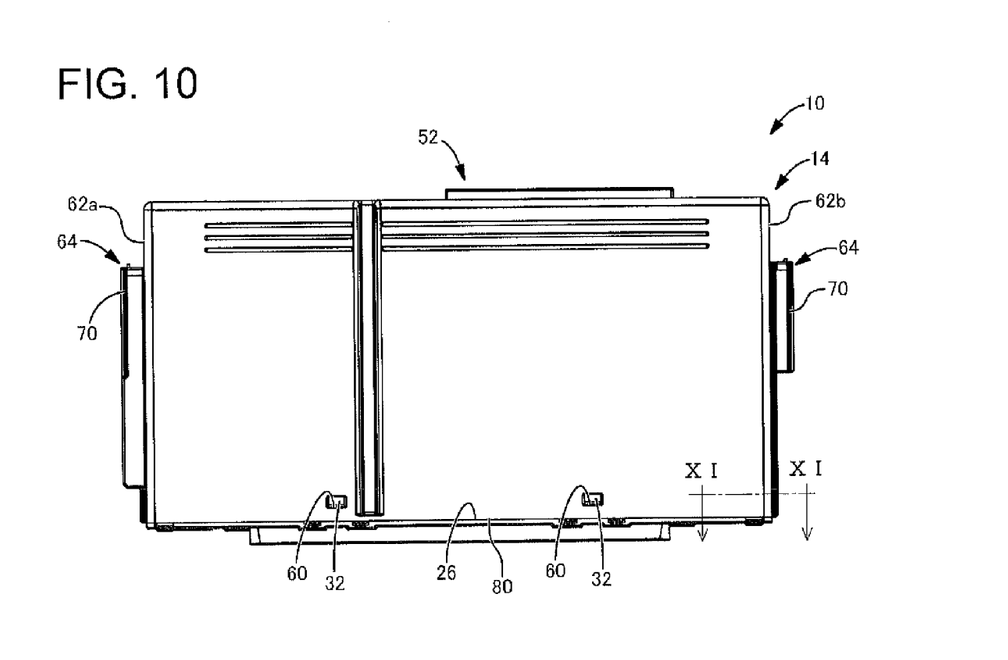
FIG. 10 is a front view showing the state in which the cover and the main body of the electrical junction box of FIG. 1 are assembled.

As shown in FIG. 1, the cover 14 may be externally fitted to the main body 12 from above. Note that the cover 14 may be configured to be guided in the vertical direction that is the direction in which the cover 14 is externally fitted to the main body 12 by the guide rib 36 of the main body 12 being inserted into the guide groove 74, and to be able to be externally fitted to the main body 12 smoothly. The extent to which the cover 14 is externally fitted to the main body 12 may be defined by the open end surface 80 of the cover 14 abutting against the abutment restricting surface 26 of the main body 12. Moreover, the cover 14 may be fixed to the main body 12 by the engaging claws 58 of the main locks 56 provided inside the cover 14 respectively engaging with the main locking claws 30 of the main body 12, and a plurality of sub lock holes 60 of the cover 14 respectively engaging with the sub locking claws 32 of the main body 12. Accordingly, as shown in FIG. 10, the main body 12 and the cover 14 may be assembled to each other in the state in which the portion of the main body 12 that is located above the abutment restricting surface 26 is accommodated in the cover 14, and thus the electrical junction box 10 is formed. Furthermore, the plurality of fuse terminals 38 (see FIG. 1 and the like) provided on the main body 12 may be arranged on the fuse mounted sections 52 provided on the cover 14.

In the electrical junction box 10 having this structure, fuses (not shown) may be respectively mounted on the respective fuse mounted sections 52. The electrical junction box 10 may be configured to be accommodated in another electrical junction box (not shown) such as a relay box, for example, and fixed thereto via the external locks 64 provided on the cover 14, and thereby the connector sections 24 may be connected to connectors provided in the other electrical junction box.

Figure 11:
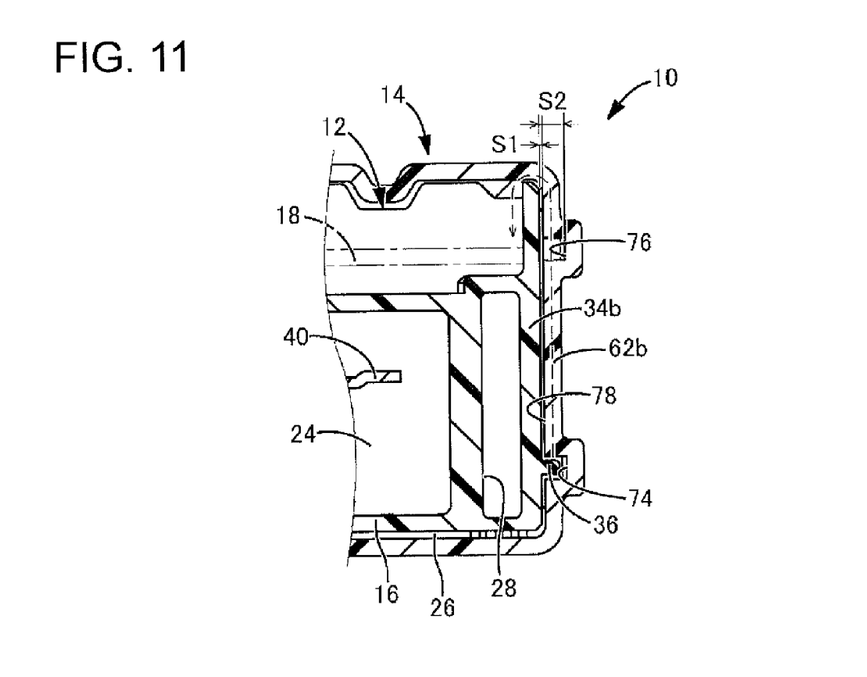
FIG. 11 illustrates a cross section that corresponds to the cross section taken along the line XI-XI of FIG. 10.

In the electrical junction box 10 having the structure according to the present embodiment, by the cover 14 being assembled to the main body 12 as shown in FIG. 11, the side wall 34b of the main body 12 and the inner surface 78 of the cover 14 are located opposing each other. An opposing distance S1 between the side wall 62b and the inner surface 78 may be set to be very small since an unnecessary space is not provided between the main body 12 and the cover 14, and may be set to about 0.2 mm, for example. Furthermore, since the water capturing groove 76 is formed on the inner surface 78 of the cover 14, the opposing distance between the main body 12 and the cover 14 may be large at the position at which the water capturing groove 76 is formed. An opposing distance S2 between the main body 12 and the cover 14 in the water capturing groove 76 (opposing distance between the side wall 34b and the groove bottom surface of the water capturing groove 76) is set to a distance in which no capillary action occurs, and may be set to about 0.7 mm, for example. Such a water capturing groove 76 is located between the guide rib 36 and the guide groove 74, and the printed circuit board 18 in the direction of the periphery of the main body 12 that is shown by the arrow in FIG. 11, and the water capturing groove 76 is arranged on the path from the guide rib 36 and the guide groove 74 to the printed circuit board 18 in the direction of the periphery of the main body 12.

Therefore, when water that has entered the cover 14 via a micro-gap between the open end surface 80 of the cover 14 and the abutment restricting surface 26 of the main body 12, or water that has climbed between the opposing surfaces of the guide rib 36 and the guide groove 74 due to capillary action and entered the cover 14 moves, due to capillary action, between the opposing surfaces of the side wall 34b and the inner surface 78 in the direction of the periphery of the main body 12 that is indicated by the arrow in FIG. 11, by preventing capillary action from occurring in the water capturing groove 76, it is possible to capture the water that moves in the direction of the periphery of the main body 12 in the water capturing groove 76 so as to prevent the water from reaching the printed circuit board 18. Accordingly, it is possible to prevent the printed circuit board 18 from getting wet, and to prevent a short circuit or corrosion of the printed circuit board 18 due to the printed circuit board 18 getting wet.

Figure 12:
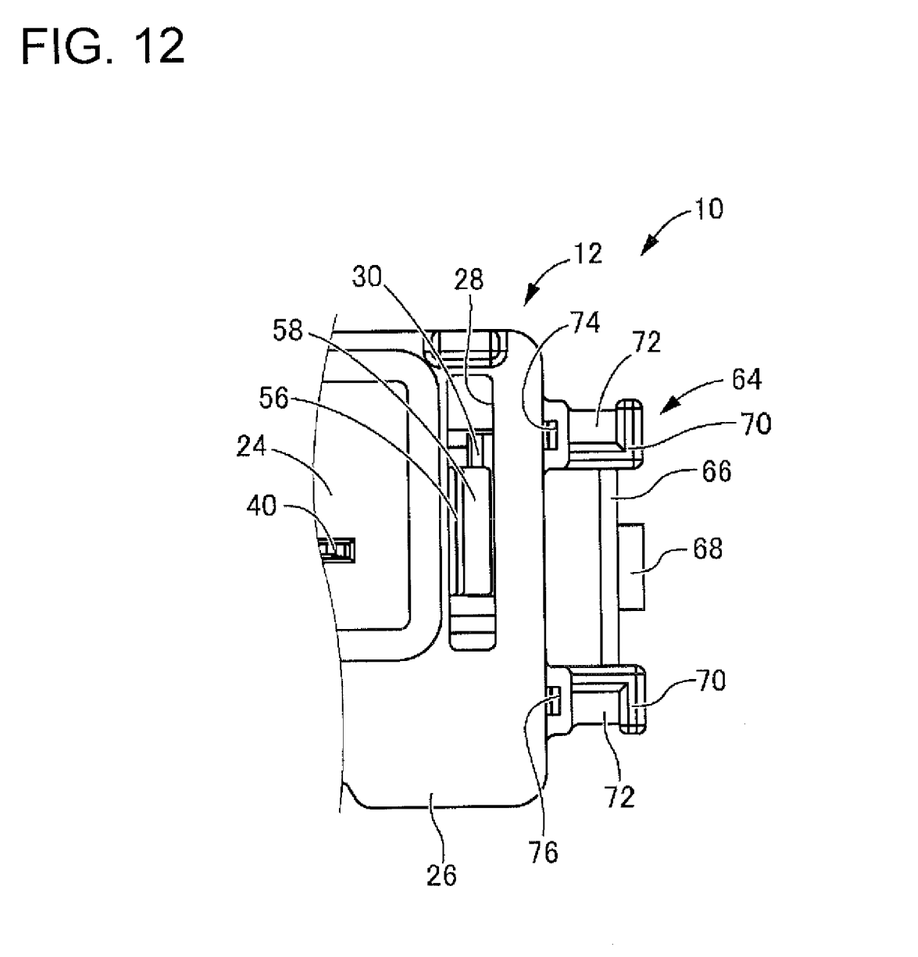
FIG. 12 is an enlarged view showing a relevant part of the lower surface of the electrical junction box shown in FIG. 10.

Furthermore, the water capturing groove 76 is formed by the side wall 62b of the cover 14 protruding outward. Accordingly, as shown in FIG. 12, at the lower end of the water capturing groove 76, the section that protrudes outward from the side wall 62b protrudes outward from the abutment restricting surface 26 and is open downward, and the water captured in the water capturing groove 76 can be drained from the lower end of the water capturing groove 76 to the outside of the electrical junction box 10.

Furthermore, since both the water capturing groove 76 and the guide groove 74 that have substantially the same shape are formed on the cover 14, it is possible to ensure a formation space in which the water capturing groove 76 and the guide groove 74 are to be formed more easily than the case where they are formed on the main body 12 side. Particularly in the present embodiment, the water capturing groove 76 and the guide groove 74 are formed below the external lock 64. The space below the external lock 64 serves as a vacant space since a lock (not shown) or the like of a counterpart is to be located therein, but effective use of this vacant space makes it possible to form the water capturing groove 76 and the guide groove 74 efficiently with regard to space. Furthermore, the extent of protrusion, serving as the water capturing groove 76 and the guide groove 74, from the side wall 62b to the outside can be suppressed to the extent equal to or smaller than the extent of protrusion of the external lock 64 from the side wall 62b, and thus it is possible to form the water capturing groove 76 and the guide groove 74 without making the outer dimension of the electrical junction box 10 larger.

Moreover, the two mis-coupling prevention grooves 82 are formed on the side wall 62a of the cover 14. The separation distance D1 (see FIG. 7) between the guide groove 74 and the water capturing groove 76 differs from the separation distance D2 between the mis-coupling prevention grooves 82, and thus if, for example, an attempt is made to externally fit the cover 14 to the main body 12 in the wrong direction, the guide rib 36 of the main body 12 will interfere with the open end surface 80 of the cover 14 to prevent the cover 14 from being externally fitted, making it possible to prevent wrong coupling of the cover 14. Furthermore, an opposing surface distance between the side wall 34a of the main body 12 and the inner surface of the cover 14 is also large in the mis-coupling prevention grooves 82, although not shown, and thus it is possible to prevent capillary action from occurring and to prevent water that has entered the cover 14 from moving in the direction of the periphery of the main body 12 using the mis-coupling prevention grooves 82.

Although preferred embodiments have been described in detail so far, the present invention is not limited to the embodiments discussed herein. For example, a plurality of water capturing grooves may also be formed on the path to the circuit board from the guide rib and the guide groove in the direction of the periphery of the main body.

Furthermore, the water capturing groove may also be provided on the main body, or the water capturing grooves may also be provided on both the main body and the cover, for example. Furthermore, when the water capturing groove is formed on the cover, the position at which the water capturing groove is formed is not limited to the side wall of the cover, and the external lock 64 according to the above-described embodiment is not necessarily essential, and the position at which the water capturing groove is formed is not limited to the position below the external lock 64. Furthermore, the water capturing groove may be formed so as to have the depth dimension to the extent of not protruding outward from the side wall of the cover instead of protruding outward from the side wall of the cover as in the above-described embodiment.

Furthermore, the guide rib and the guide groove may be provided on either of the main body and the cover, and, for example, the cover may be provided with the guide rib and the main body may be provided with the guide groove. Moreover, a plurality of guide ribs and guide grooves may also be provided in the direction of the periphery of the main body.

The invention claimed is:

1. An electrical junction box comprising:
a main body provided with a circuit board; and
a cover arranged to accommodate the main body,
one of the main body and the cover having a guide rib, and another one of the main body and the cover having a guide groove, the guide rib and the guide groove being arranged relative to each other so as to guide the cover to the main body,
wherein the circuit board is arranged inside a side wall of the main body which is overlapped by the cover, and the guide rib or the guide groove is formed on an outer surface of the side wall, and
at least one of the side wall of the main body and the cover that overlaps the side wall has a water capturing groove that is located at a position between the guide rib or the guide groove and the circuit board relative to a first direction along a periphery of the main body such that the water capturing groove is arranged to capture water that has entered the cover via a gap between the guide rib and the guide groove before the water reaches the circuit board.

2. The electrical junction box according to claim 1, wherein the guide rib is formed on the main body, and the guide groove and the water capturing groove are formed on the cover.

3. The electrical junction box according to claim 2, wherein a lock section is formed on an outer surface of the cover, and the guide groove and the water capturing groove are formed protruding outward from the outer surface of the cover at locations between the lock section and an opening of the cover.

4. The electrical junction box according to claim 3, wherein the guide groove and the water capturing groove are located spaced from the lock section relative to a second direction orthogonal to the first direction.

5. The electrical junction box according to claim 3, wherein the guide groove and the water capturing groove protrude a first protrusion amount from a first side wall of the cover, and the lock section protrudes a second protrusion amount from the first side wall of the cover, the second protrusion amount being greater than or equal to the first protrusion amount.

6. The electrical junction box according to claim 3, wherein the lock section includes a first guide section and a second guide section, the first guide section being aligned with the guide groove and the second guide section being aligned with the water capturing groove relative to a second direction orthogonal to the first direction.

7. The electrical junction box according to claim 6, wherein each of the first and second guide sections has a first guide portion and a second guide portion, the first guide portion protruding orthogonally relative to the second guide portion.

8. The electrical junction box according to claim 2, wherein an end of the water capturing groove is open at an open end surface of the cover.

9. The electrical junction box according to claim 1, wherein the at least one of the side wall of the main body and the cover has both the guide groove and the water capturing groove, the guide groove and the water capturing being spaced from each other in the first direction along the periphery of the main body.

10. The electrical junction box according to claim 9, wherein
the guide groove and the water capturing groove open in an inner surface of the at least one of the side wall of the main body and the cover.

11. The electrical junction box according to claim 9, wherein
the guide groove and the water capturing groove extend parallel to each other, with an upper end edge of the guide groove being at substantially the same position as an upper end edge of the water capturing groove relative to a second direction orthogonal to the first direction.

12. The electrical junction box according to claim 2, wherein
the cover has an open end surface arranged to abut against an abutment restricting surface of the main body, and the water capturing groove protrudes from the cover beyond the abutment restricting surface.

13. The electrical junction box according to claim 2, wherein
an inner surface of the cover is spaced from an outer surface of the main body by a first distance at a location of the water capturing groove and by a second distance at a location spaced from the water capturing groove, the first distance being greater than the second distance.

14. The electrical junction box according to claim 1, wherein
the cover has both the guide groove and the water capturing groove, the guide groove and the water capturing groove being located on a first side wall of the cover and being spaced from each other in the first direction by a first distance, and
the cover further has at least two mis-coupling prevention grooves disposed on a second side wall of the cover, the mis-coupling prevention grooves being spaced from each other in the first direction by a second distance that is different from the first distance.

* * * * *